(12) United States Patent
Bedell et al.

(10) Patent No.: US 9,899,274 B2
(45) Date of Patent: Feb. 20, 2018

(54) LOW-COST SOI FINFET TECHNOLOGY

(71) Applicant: International Business Machines Corporation, Armonk, NY (US)

(72) Inventors: Stephen W. Bedell, Wappingers Falls, NY (US); Joel P. de Souza, Putnam Valley, NY (US); Alexander Reznicek, Troy, NY (US); Devendra K. Sadana, Pleasantville, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 14/658,269

(22) Filed: Mar. 16, 2015

(65) Prior Publication Data
US 2016/0276226 A1    Sep. 22, 2016

(51) Int. Cl.
| | |
|---|---|
| *H01L 21/00* | (2006.01) |
| *H01L 21/84* | (2006.01) |
| *H01L 21/762* | (2006.01) |
| *H01L 21/02* | (2006.01) |
| *H01L 21/306* | (2006.01) |
| *H01L 21/308* | (2006.01) |

(52) U.S. Cl.
CPC ...... *H01L 21/845* (2013.01); *H01L 21/76224* (2013.01); *H01L 21/76245* (2013.01); *H01L 21/02238* (2013.01); *H01L 21/02255* (2013.01); *H01L 21/306* (2013.01); *H01L 21/3081* (2013.01)

(58) Field of Classification Search
CPC ................................................. H01L 21/76245
See application file for complete search history.

(56) References Cited

U.S. PATENT DOCUMENTS

| | | | |
|---|---|---|---|
| 4,628,591 A | 12/1986 | Zorinsky et al. | |
| 5,387,541 A | 2/1995 | Hodge et al. | |
| 5,950,094 A | 9/1999 | Lin et al. | |
| 6,143,190 A * | 11/2000 | Yagi .................. | B41J 2/1603 |
| | | | 205/157 |
| 6,506,658 B2 | 1/2003 | D'arrigo et al. | |
| 6,583,015 B2 | 6/2003 | Fitzgerald et al. | |
| 7,067,387 B2 | 6/2006 | Lin | |
| 7,101,742 B2 | 9/2006 | Ko et al. | |

(Continued)

OTHER PUBLICATIONS

Li et al., "Ultra-thin-film Silicon-on-Insulator Structure Using Oxidized Porous Silicon", 4th IEEE International Conference on Solid-State and Integrated Circuit Technology, pp. 266-268, 1995.

(Continued)

*Primary Examiner* — Reema Patel
(74) *Attorney, Agent, or Firm* — Steven J. Meyers; Hoffman Warnick LLC (57) ABSTRACT

A method of forming an SOI fin using a porous semiconductor. The method may include forming a stack of semiconductor layers on a substrate, the stack includes a second semiconductor layer on a first semiconductor layer in a layered region; forming fins in the second semiconductor layer by etching a trench through an exposed portion of the of the second semiconductor layer; converting the first semiconductor layer into a porous semiconductor layer using a porousification process; and converting the porous semiconductor layer into an oxide layer.

15 Claims, 9 Drawing Sheets

(56) References Cited

U.S. PATENT DOCUMENTS

| | | |
|---|---|---|
| 7,125,458 B2 | 10/2006 | Bedell et al. |
| 7,485,520 B2 | 2/2009 | Zhu et al. |
| 7,566,482 B2 * | 7/2009 | Choe ................. H01L 21/76245 |
| | | 205/123 |
| 7,646,068 B2 | 1/2010 | Ko et al. |
| 7,767,541 B2 | 8/2010 | Cheng et al. |
| 7,867,860 B2 | 1/2011 | Huang et al. |
| 7,888,201 B2 | 2/2011 | Yeo et al. |
| 2005/0230763 A1 | 10/2005 | Huang et al. |
| 2007/0018201 A1 * | 1/2007 | Specht .................... H01L 21/84 |
| | | 257/204 |
| 2010/0221867 A1 * | 9/2010 | Bedell ................. H01L 21/7624 |
| | | 438/96 |

OTHER PUBLICATIONS

Oules et al., "Silicon on Insulator Structures Obtained by Epitaxial Growth of Silicon over Porous Silicon", J. Electrochem. Soc., vol. 139, No. 12, Dec. 1992, pp. 3595-3599.

* cited by examiner

LOW-COST SOI FINFET TECHNOLOGY

BACKGROUND

The present invention generally relates to semiconductor device manufacturing, and more particularly to the formation of semiconductor-on-insulator (SOI) fins using porous silicon.

In SOI technology, the SOI layer and bulk substrate layer are separated by a continuous insulating layer referred to as a buried oxide (BOX). This separation or isolation of the device layer (i.e., the SOI layer) can result in significant benefits and performance improvements including, for example, less junction capacitance and leakage; greater resistance to ionizing radiation, electrical noise and heat; and immunity to CMOS latch-up.

Only a few methods to fabricate SOI substrates are proven to be commercially viable. In one, called BESOI (bond-and-etch-back SOI), two Si wafers are oxidized at the surface and the oxidized surfaces are bonded together and then one of the two bonded wafers is etched or thinned to provide a thin SOI device layer. In this method and its variations, the thickness of the buried oxide layer can be controlled during oxidation of the surfaces of the two silicon wafers. Therefore, the buried oxide can be made to have any desired thickness; however, the above process may introduce impurities at the bonded interface between the two oxidized surfaces. Further, etch-back or thinning of one silicon wafer to produce the thin SOI device layer may result in a non-uniform surface presenting challenges during subsequent processing.

In another well-known method, called SIMOX (separation by implantation of oxygen), a selected dose of oxygen ions is directly implanted into a Si wafer, and then the wafer is annealed in an oxygen ambient at a high temperature so that the implanted oxygen is converted into a continuous buried oxide layer. The thickness of the buried oxide layer in the SIMOX method is mostly dependent on the implanted oxygen dose and the thermal oxidation conditions. Moreover, in SIMOX, the Si over-layer is thinned to a desired thickness during the thermal oxidation, after which the surface oxide is stripped off.

Normally, SIMOX processes may require an oxygen concentration or dose of about $3E17$ cm$^{-2}$ to about $5E17$ cm$^{-2}$ to form a low-defect, continuous buried oxide layer that separates the Si over-layer from the substrate. In order to facilitate the implantation of this high level of oxygen ions in a reasonable period of time, high-current implanters are specifically built for SIMOX application at an extra cost.

SUMMARY

According to one embodiment of the present invention, a method is provided. The method may include forming a stack of semiconductor layers on a substrate, the stack includes a second semiconductor layer on a first semiconductor layer in a layered region; forming fins in the second semiconductor layer by etching a trench through an exposed portion of the of the second semiconductor layer; converting the first semiconductor layer into a porous semiconductor layer using a porousification process; and converting the porous semiconductor layer into an oxide layer.

According to another embodiment of the present invention, a method is provided. The method may include forming a stack of semiconductor layers on a substrate, the stack includes a second semiconductor layer on a first semiconductor layer; forming fins in the stack by forming a patterned mask on the second semiconductor layer and etching a trench through exposed portions of the stack exposing a top surface of the substrate, wherein the fins include a first fin, the first fin includes a portion of the first semiconductor layer and a portion of the second semiconductor layer; converting the portion of the first semiconductor layer of the first fin into a porous semiconductor layer using a porousification process; converting the porous semiconductor layer into an oxide layer; and forming a shallow trench isolation (STI) in the trench, the STI is directly on the substrate, and the STI isolates adjacent fins.

According to another embodiment of the present invention, a method is provided. The method may include forming a stack of semiconductor layers on a substrate, the stack includes a second semiconductor layer on a first semiconductor layer; forming a patterned mask on the second semiconductor layer exposing a portion of the semiconductor layer; forming a fin in a portion of the second semiconductor layer by etching a trench through the exposed portion of the second semiconductor layer exposing a top surface of the first semiconductor layer, the fin includes a portion of the second semiconductor layer; converting the first semiconductor layer into a porous semiconductor layer using a porousification process; forming spacers on sidewalls of the fin, wherein the spacers are above the porous semiconductor layer; and converting the porous semiconductor layer into an oxide layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the formation of semiconductor-on-insulator (SOI) fins using porous silicon. Ideally, it may be desirable to form a device fin (e.g., a fin for a FinFET) on an insulator without the expansive time, steps, and cost of typical SOI fin formation. One way to fabricate an SOI fin without the time, steps, and cost of a typical SOI fin is to form the SOI fin using a porous semiconductor converted from a bulk semiconductor, such as silicon. Exemplary embodiments by which to form a SOI fin using porous silicon is described in detail below referring to the accompanying drawings FIGS. 1-15.

Figure 1:
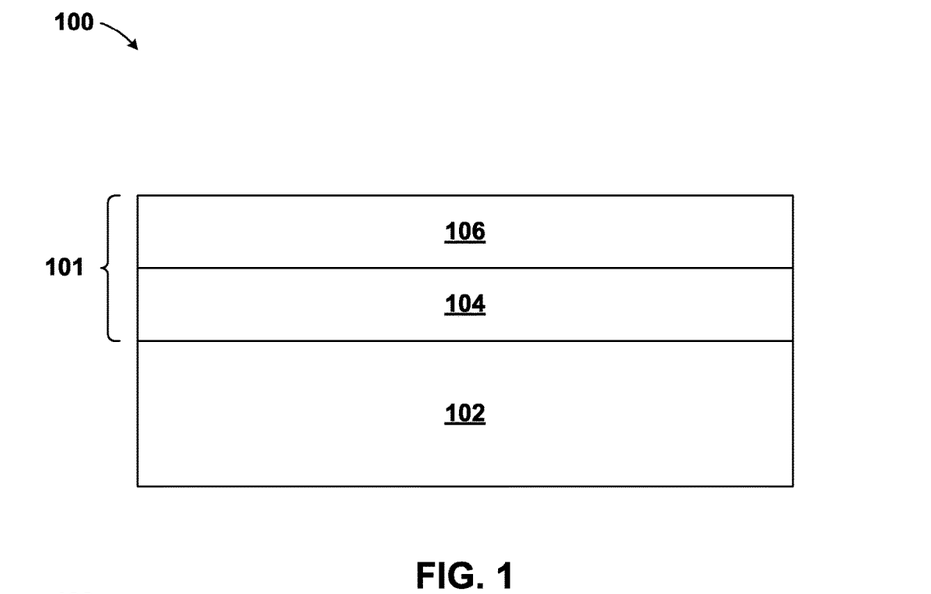
FIG. 1 is a cross section view of a semiconductor structure, according to an exemplary embodiment.

With reference to FIG. 1, a demonstrative illustration of a structure 100 is provided during an intermediate step of a method of fabricating an SOI fin using porous silicon, according to an embodiment. More specifically, the method can start by forming a first stack 101 on a substrate 102.

The substrate 102 may include; a bulk semiconductor substrate, a layered semiconductor substrate (e.g., Si/SiGe), a silicon-on-insulator substrate (SOI), or a SiGe-on-insulator substrate (SGOI). The substrate 102 may include any semiconductor material known in the art, such as, for example; Si, Ge, SiGe, SiC, SiGeC, Ga, GaAs, InAs, InP, or other elemental or compound semiconductors. The substrate 102 may include, for example; an n-type, p-type, or undoped semiconductor material and may have a monocrystalline, polycrystalline, or amorphous structure. In an embodiment, the substrate 102 is a silicon wafer.

The first stack 101 may include a second layer 106 on a first layer 104. The first layer 104 may be formed on the substrate 102 using any deposition technique known in the art, such as, for example, epitaxial growth, chemical vapor deposition (CVD), physical vapor deposition (PVD), or atomic layer deposition (ALD). The first layer 104 can be any semiconductor material known in the art, such as, for example, silicon or SiGe. The first layer 104 may have a thickness ranging from about 100 nm to about 200 nm; however, other thicknesses may be used. In an embodiment, the first layer 104 is p+ doped silicon grown using epitaxy or implant techniques and may have a dopant concentration of about 2E20 $cm^{-3}$ (i.e., $2 \times 10^{20}$ atoms per centimeter cubed).

The second layer 106 may be formed on the first layer 104 using any deposition technique known in the art, such as, for example, epitaxial growth, chemical vapor deposition (CVD), physical vapor deposition (PVD), or atomic layer deposition (ALD). The second layer 106 can be any semiconductor material known in the art, such as, for example, silicon or SiGe. The second layer 106 may have a thickness ranging from about 30 nm to about 70 nm; however, other thicknesses may be used. In an embodiment, the second layer 106 is p-doped silicon or SiGe, or n− doped germanium, and may have a dopant concentration of about 2E18 $cm^{-3}$ (i.e., $2 \times 10^{18}$ atoms per centimeter cubed).

Figure 2:
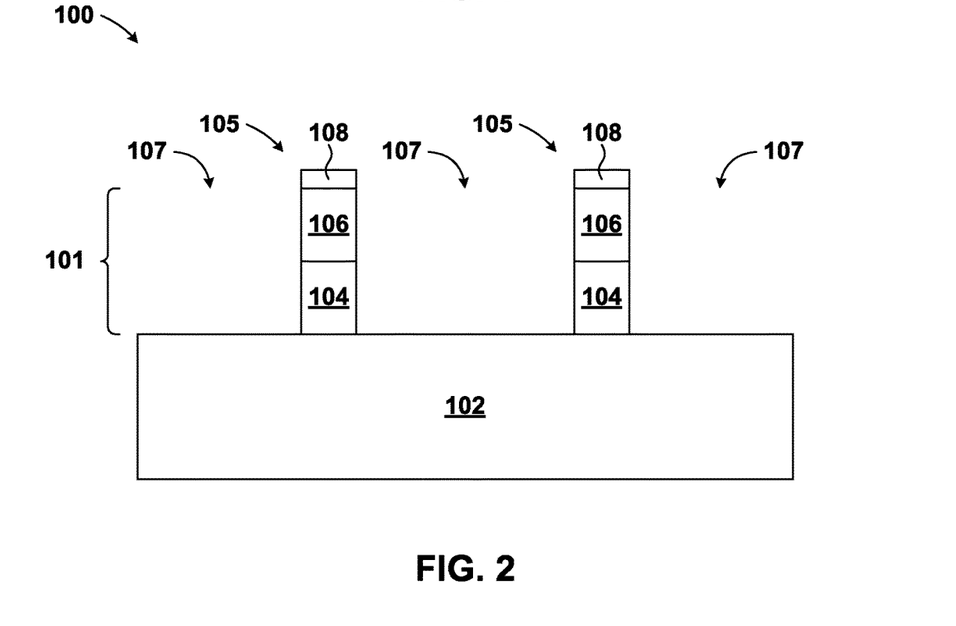
FIG. 2 is a cross section view of the semiconductor structure and illustrates the formation of a fin in a first stack, according to an exemplary embodiment.

With reference to FIG. 2, a demonstrative illustration of the structure 100 is provided during an intermediate step of a method of fabricating an SOI fin using porous silicon, according to an embodiment. More specifically, the method can include forming a fin 105 in the first stack 101.

The fin 105 may include a bottom portion (e.g., a portion of the first layer 104) and a top portion (e.g., a portion of the second layer 106). The fin 105 may be formed by etching a first trench 107 through the first stack 101 using any fin formation technique known in the art, such as, for example, a mask and etching technique. A hardmask 108 may be used to protect the fin 105 during the etching of the first trench 107. The hardmask 108 may be formed on the second layer 106 using any deposition technique known in the art, such as, for example, chemical vapor deposition, plasma enhanced chemical vapor deposition, atomic layer deposition, or physical vapor deposition. The hardmask 108 may include any masking material known in the art, such as, for example, silicon nitride ($Si_3N_4$), silicon carbide (SiC), silicon carbon nitride (SiCN), hydrogenated silicon carbide (SiCH), or any other masking material. In an embodiment, the hardmask 108 is a silicon nitride. The hardmask 108 may be patterned using any patterning technique known in the art, such as, for example, photolithography and may be patterned to define subsequently formed fins (e.g., the fin 105). The hardmask 108 can cover the fin 105, such that adjacent portions of the second layer 106 are exposed.

The first trench 107 may be etched by removing the exposed portions of the second layer 106 and an underlying portion of the first layer 104. The first trench 107 may be etched using any etching technique known in the art, such as, for example, a wet or dry etch. The first trench 107 may be etched through the exposed portion of the second layers 106 and the underlying first layer 104, such that a top surface of the substrate 102 is exposed. The exposed top surface of the substrate 102 may be on both sides of the fin 105 and/or between adjacent fins 105.

Figure 3:
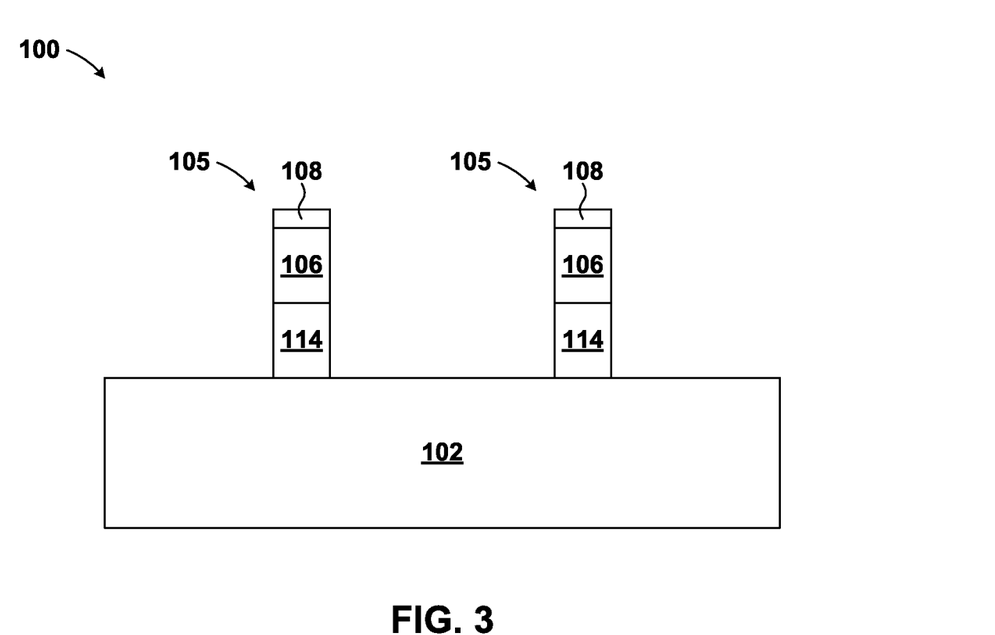
FIG. 3 is a cross section view of the semiconductor structure and illustrates the conversion of a first layer into a porous layer, according to an exemplary embodiment.

With reference to FIG. 3, a demonstrative illustration of the structure 100 is provided during an intermediate step of a method of fabricating an SOI fin using porous silicon, according to an embodiment. More specifically, the method can include converting the bottom portion of the fin 105 (e.g., the first layer 104) into a porous layer 114.

The first layer 104 may be converted into the porous layer 114 using any porousification technique know in the art, such as, for example, anodization or electrolytic reaction. In an anodization process, the structure 100 may be immersed into a hydrofluoric fluoride (HF) bath and applying an electrical bias to the structure 100, where the HF bath reacts with the highly doped first layer 104 forming pores in the first layer 104 and converting the first layer 104 into the porous layer 114. The first layer 104 may be converted into the porous layer 114 while not converting the second layer 106 because of the lower dopant levels of the second layer 106. The porous layer 114 may be adjusted to make the semiconductor material tensile or compressively strained. One benefit to converting the bottom portion of a fin into a porous semiconductor is to allow for subsequent oxidation of the porous semiconductor to create an insulation layer between the substrate 102 and the top portion of the fin 105 (e.g., the second layer 106).

Figure 4:
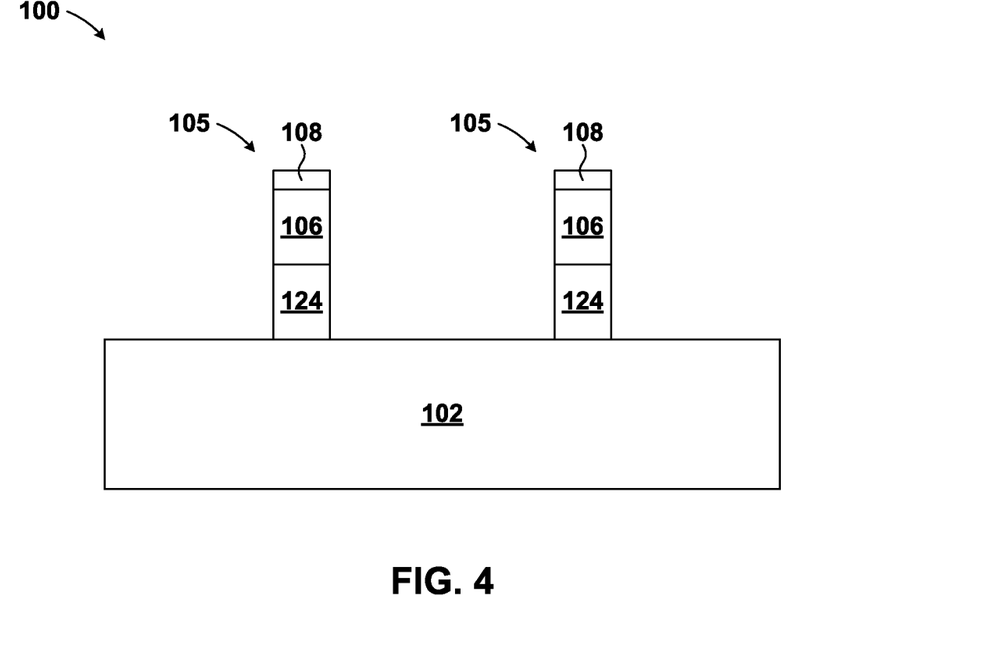
FIG. 4 is a cross section view of the semiconductor structure and illustrates the conversion of the porous layer into an oxide layer, according to an exemplary embodiment.

With reference to FIG. 4, a demonstrative illustration of the structure 100 is provided during an intermediate step of a method of fabricating a SOI fin using porous silicon, according to an embodiment. More specifically, the method can include converting the porous layer 114 into an oxide layer 124.

Porous semiconductors may exhibit different physical and chemical properties from a non-porous semiconductor, as is well known in the art. The porous semiconductor may be more conducive to oxidation because of its properties, such as, for example, surface to volume ratio.

The porous layer 114 may be converted into the oxide layer 124 using any oxidation techniques known in the art, such as, for example, thermal oxidation, low temperature oxidation, plasma oxidation, ozone oxidation, chemical oxidation, a combination of techniques, or any other oxidation techniques. Thermal oxidation may be performed in a dry oxidizing ambient atmosphere and at a temperature ranging from about 750° C. to about 1100° C. to convert the porous layer 114 into the oxide layer 124. The porous layer 114 may be converted into the oxide layer 124 because of the rapid reaction rates between oxygen-containing species and porous materials such as the porous layer 114. In an embodiment, the porous layer 114 is silicon, a low temperature oxidation process is used, and the oxide layer 124 is $SiO_2$.

Figure 5:
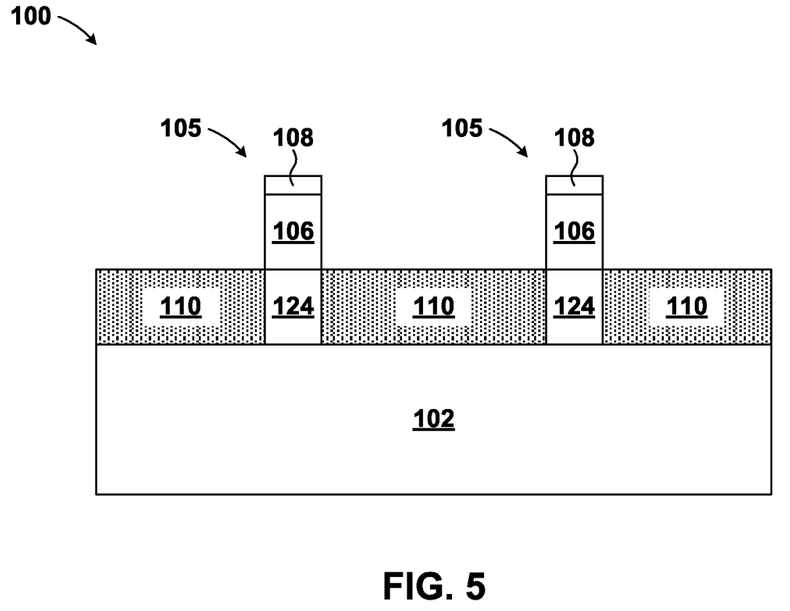
FIG. 5 is a cross section view of the semiconductor structure and illustrates the formation of a shallow trench isolation (STI) between adjacent fins, according to an exemplary embodiment.

With reference to FIG. 5, a demonstrative illustration of the structure 100 is provided during an intermediate step of a method of fabricating a SOI fin using porous silicon, according to an embodiment. More specifically, the method can include forming a shallow trench isolation (STI) 110 on each side of the fin 105 and/or between adjacent fins 105.

The STI 110 may be formed in the first trench 107 using any isolation formation techniques known in the art, such as, for example, a dielectric deposition and etch back process. The STI 110 may be any dielectric material known in the art, such as, for example, a silicon oxide and/or a silicon nitride. An optional trench liner may be used to line the first trench 107 between the fin 105 and the STI 110. The STI 110 may be recessed such that the second layer 106 is exposed. The STI 110 may have a top surface that is coplanar with a top surface of the first layer 104. The fin 105 may have similar properties as a typical SOI fin, as is known in the art; however, the described embodiment may save processing time and cost because the fin 105 was formed using a porous semiconductor.

Figure 6:
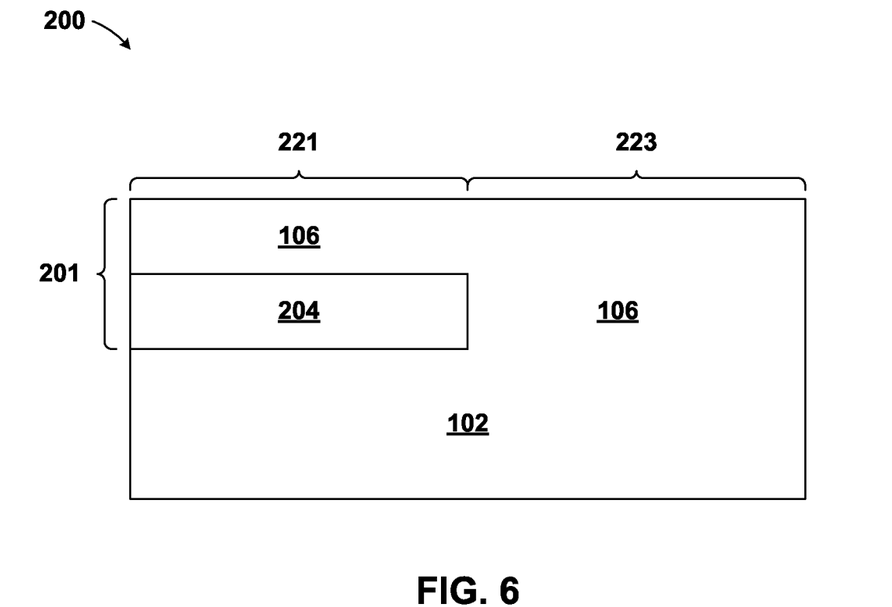
FIG. 6 is a cross section view of an alternative semiconductor structure, according to an exemplary embodiment.

With reference to FIG. 6, a demonstrative illustration of an alternative structure 200 is provided during an intermediate step of a method of fabricating an SOI fin using porous silicon next to a bulk fin, according to an embodiment. More specifically, the method can start by forming a second stack 201 on the substrate 102.

The second stack 201 may include the second layer 106 on a first layer 204 in a layered region 221. The second stack 201 may also include the second layer 106 directly on the substrate 102 in a bulk region 223. It should be noted, the second stack 201 in the layered region 221 may be similar to the first stack 101, described in reference to FIG. 1. Also, the second stack 201 in the layered region 221 may be subsequently processed in a similar fashion as the first stack 101, described in reference to FIGS. 1-5.

The second stack 201 may be formed using any stack formation technique known in the art, such as, for example, a subtractive etch or trench and fill technique. The second stack 201 may subsequently allow for an SOI fin to be formed using porous silicon next to a bulk fin.

Figure 7:
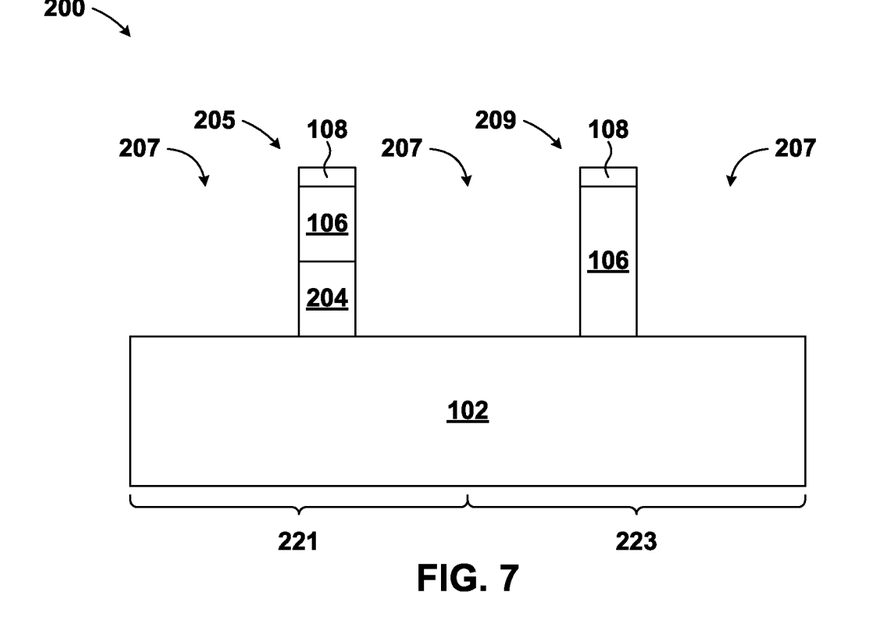
FIG. 7 is a cross section view of the alternative semiconductor structure and illustrates the formation of an SOI fin in a layered region and a bulk fin in a bulk region, according to an exemplary embodiment.

With reference to FIG. 7, a demonstrative illustration of the alternative structure 200 is provided during an intermediate step of a method of fabricating an SOI fin using porous silicon next to a bulk fin, according to an embodiment. More specifically, the method can include forming an SOI fin 205 and a bulk fin 209 in the second stack 201. It should be noted, the SOI fin 205 may be similar to the fin 105 described in reference to FIG. 2.

The SOI fin 205 may be formed in the layered region 221 and the bulk fin 209 may be formed in the bulk region 223 of the second stack 201. The SOI fin 205 may include a bottom portion (e.g., a portion of the first layer 204) and a top portion (e.g., a portion of the second layer 106). It should be noted, the SOI fin 205 may be referred to as a first fin and the bulk fin 209 may be referred to as a second fin.

The SOI fin 205 and the bulk fin 209 may be formed in the second stack 201 using any fin formation technique known in the art, such as, for example, a mask and etching technique. A hardmask 108 may be used to protect the SOI fin 205 and the bulk fin 209 during the etching of the second trench 207. The hardmask 108 may be formed on the second layer 106 using any deposition technique known in the art, such as, for example, chemical vapor deposition, plasma enhanced chemical vapor deposition, atomic layer deposition, or physical vapor deposition. The hardmask 108 may be on the second layer 106 in the layered region 221 and in the bulk region 223. The hardmask 108 may include any masking material known in the art, such as, for example, silicon nitride ($Si_3N_4$), silicon carbide (SiC), silicon carbon nitride (SiCN), hydrogenated silicon carbide (SiCH), or any other masking material. In an embodiment, the hardmask 108 is a silicon nitride. The hardmask 108 may be patterned using any patterning technique known in the art, such as, for example, photolithography and may be patterned to define subsequently formed fins (e.g., the SOI fin 205 and the bulk fin 209). The patterned hardmask 108 can cover the SOI fin 205 and the bulk fin 209, such that adjacent portions of the second layer 106 are exposed. The second trench 207 may be etched by removing the exposed portions of the second layer 106 and an underlying portion of the first layer 204.

The second trench 207 may be etched using any etching technique known in the art, such as, for example, a wet or dry etch. The second trench 207 may be etched through the exposed portion of the second layer 106 and the underlying first layer 204, such that a top surface of the substrate 102 is exposed. The exposed top surface of the substrate 102 may be on both sides of the SOI fin 205, on both sides of the bulk fin 209, and/or between any adjacent fins.

Figure 8:
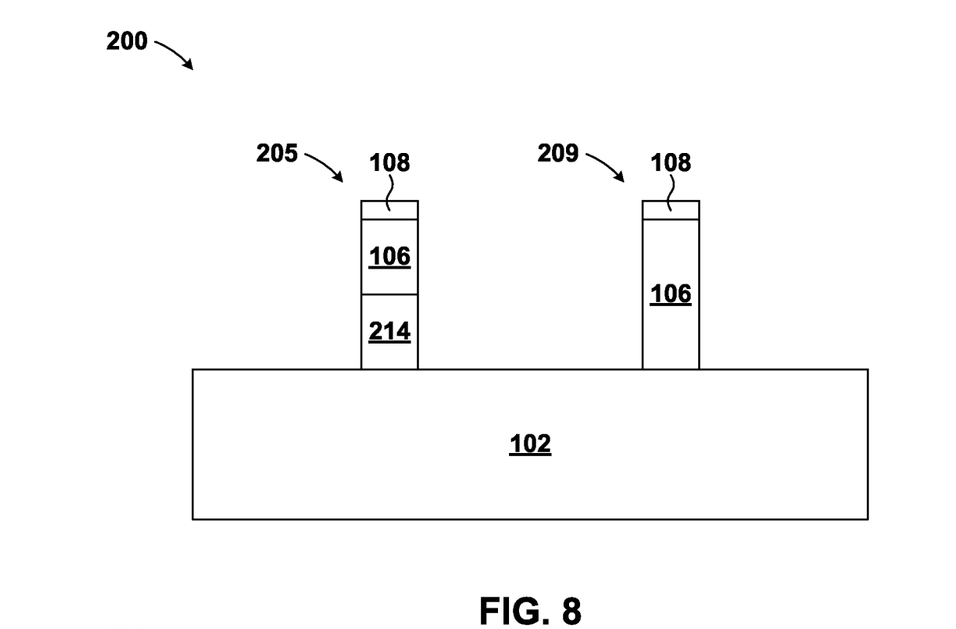
FIG. 8 is a cross section view of the alternative semiconductor structure and illustrates the conversion of a first layer into a porous layer, according to an exemplary embodiment.

With reference to FIG. 8, a demonstrative illustration of the alternative structure 200 is provided during an intermediate step of a method of fabricating an SOI fin using porous silicon next to a bulk fin, according to an embodiment. More specifically, the method can include converting the bottom portion of the SOI fin 205 (e.g., the first layer 204) into a porous layer 214. The first layer 204 may be converted into the porous layer 214 in a similar fashion as the first layer 104 converting into the porous layer 114, described in reference to FIG. 3.

Figure 9:
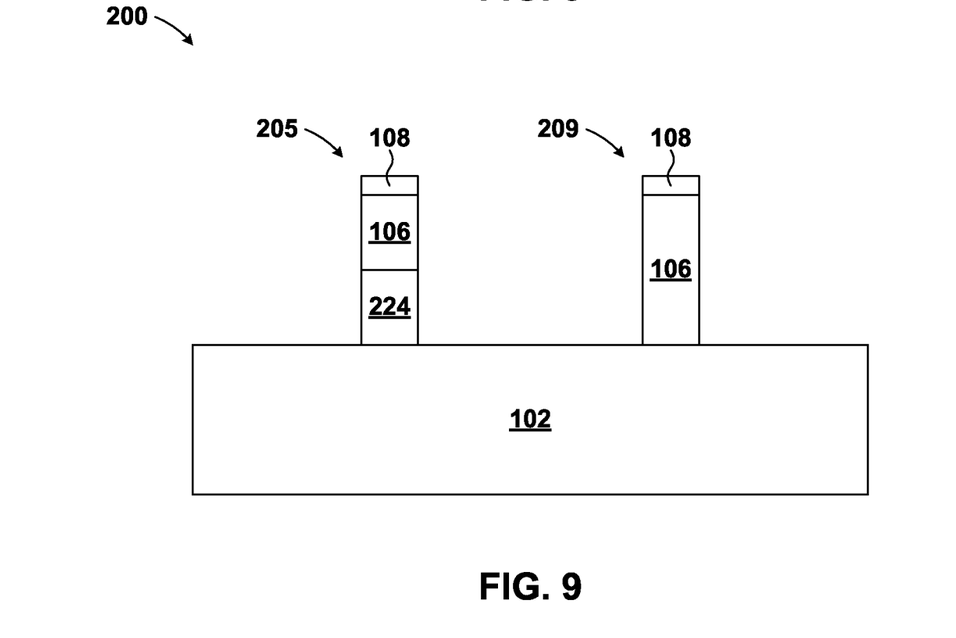
FIG. 9 is a cross section view of the alternative semiconductor structure and illustrates the conversion of the porous layer into an oxide layer, according to an exemplary embodiment.

With reference to FIG. 9, a demonstrative illustration of the alternative structure 200 is provided during an intermediate step of a method of fabricating an SOI fin using porous silicon next to a bulk fin, according to an embodiment. More specifically, the method can include converting the porous layer 214 into an oxide layer 224. The porous layer 214 may be converted into the oxide layer 224 in a similar fashion as the porous layer 114 converting into the oxide layer 124, described in reference to FIG. 4.

Figure 10:
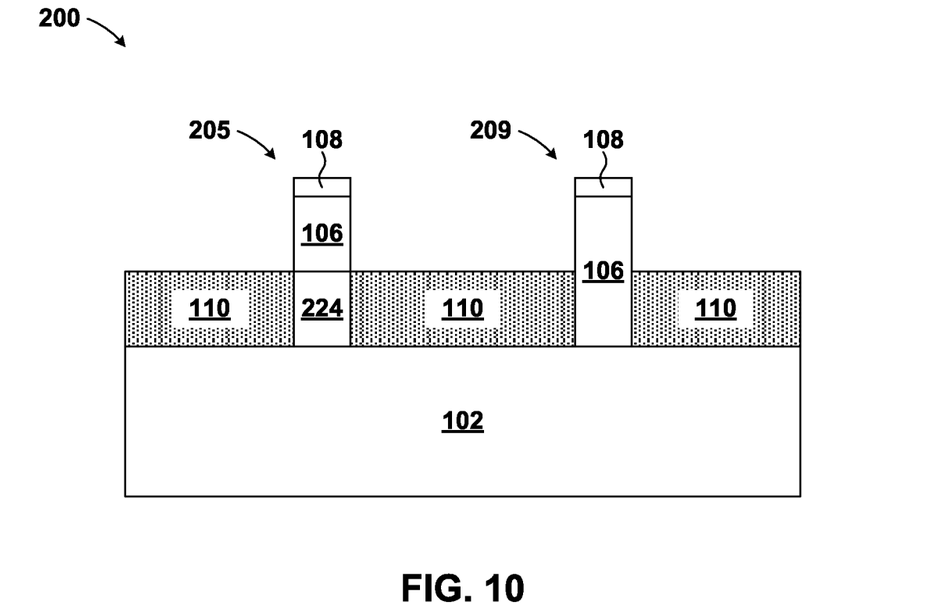
FIG. 10 is a cross section view of the alternative semiconductor structure and illustrates the formation of a shallow trench isolation (STI) between adjacent fins, according to an exemplary embodiment.

With reference to FIG. 10, a demonstrative illustration of the alternative structure 200 is provided during an intermediate step of a method of fabricating an SOI fin using porous silicon next to a bulk fin, according to an embodiment. More specifically, the method can include forming a shallow trench isolation (STI) 110 on each side of the SOI fin 205, on each side of the bulk fin 209, and/or between any adjacent fins. The STI 110 may be formed in a similar fashion as described in reference to FIG. 5.

Figure 11:
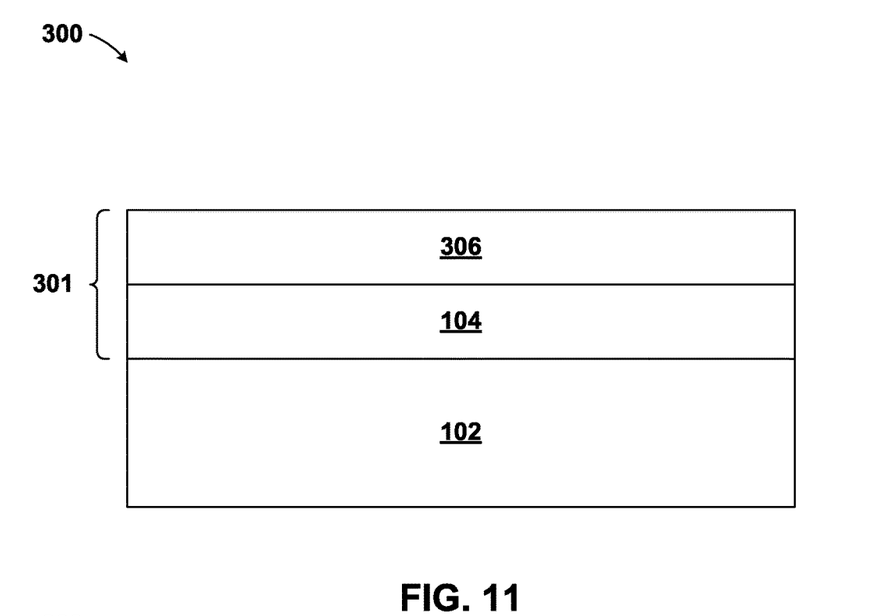
FIG. 11 is a cross section view of an alternative semiconductor structure, according to an exemplary embodiment.

With reference to FIG. 11, a demonstrative illustration of an alternative structure 300 is provided during an intermediate step of a method of fabricating an SOI fin using porous silicon, according to an embodiment. More specifically, the method can start by forming a third stack 301 on the substrate 102. It should be noted, the third stack 301 may be similar to the first stack 101 described in reference to FIG. 1.

The third stack 301 may include a second layer 306 on the first layer 104. The second layer 306 may be formed on the first layer 104 using any deposition technique known in the art, such as, for example, epitaxial growth, chemical vapor deposition (CVD), physical vapor deposition (PVD), or atomic layer deposition (ALD). The second layer 306 can be any semiconductor material known in the art, such as, for example, germanium or SiGe. The second layer 306 may have a thickness ranging from about 40 nm to about 70 nm; however, other thicknesses may be used. In an embodiment, the second layer 306 is n– doped germanium and may have a dopant concentration of about 2E18 $cm^{-3}$ (i.e., $2\times10^{18}$ atoms per centimeter cubed).

Figure 12:
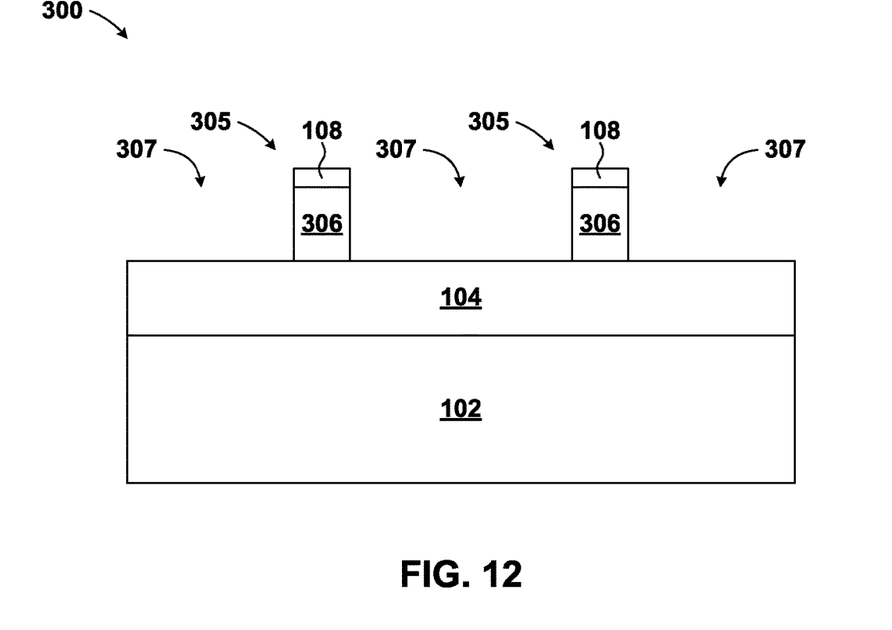
FIG. 12 is a cross section view of the alternative semiconductor structure and illustrates the formation of a fin in a second semiconductor layer, according to an exemplary embodiment.

With reference to FIG. 12, a demonstrative illustration of the alternative structure 300 is provided during an intermediate step of a method of fabricating an SOI fin using porous silicon, according to an embodiment. More specifically, the method can include forming an alternative fin 305.

The alternative fin 305 may include a portion of the second layer 306. The alternative fin 305 may be formed by etching a third trench 307 through the second layer 306 using any fin formation technique known in the art, such as, for example, a mask and etching technique.

A hardmask 108 may be used to protect the alternative fin 305 during the etching of the third trench 307. The hardmask 108 may be formed on the second layer 306 using any deposition technique known in the art, such as, for example, chemical vapor deposition, plasma enhanced chemical vapor deposition, atomic layer deposition, or physical vapor deposition. The hardmask 108 may include any masking material known in the art, such as, for example, silicon nitride ($Si_3N_4$), silicon carbide (SiC), silicon carbon nitride (SiCN), hydrogenated silicon carbide (SiCH), or any other masking material. In an embodiment, the hardmask 108 is a silicon nitride. The hardmask 108 may be patterned using any patterning technique known in the art, such as, for example, photolithography and may be patterned to define subsequently formed fins (e.g., the alternative fin 305). The hardmask 108 can cover the alternative fin 305, such that adjacent portions of the second layer 306 are exposed.

The third trench 307 may be etched by removing the exposed portions of the second layer 306. The third trench 307 may be etched using any etching technique known in the art, such as, for example, a wet or dry etch. The third trench 307 may be etched through the exposed portion of the second layers 106, such that a top surface of the first layer 104 is exposed. The exposed top surface of the first layer 104 may be on both sides of the alternative fin 305 and/or between adjacent fins.

Figure 13:
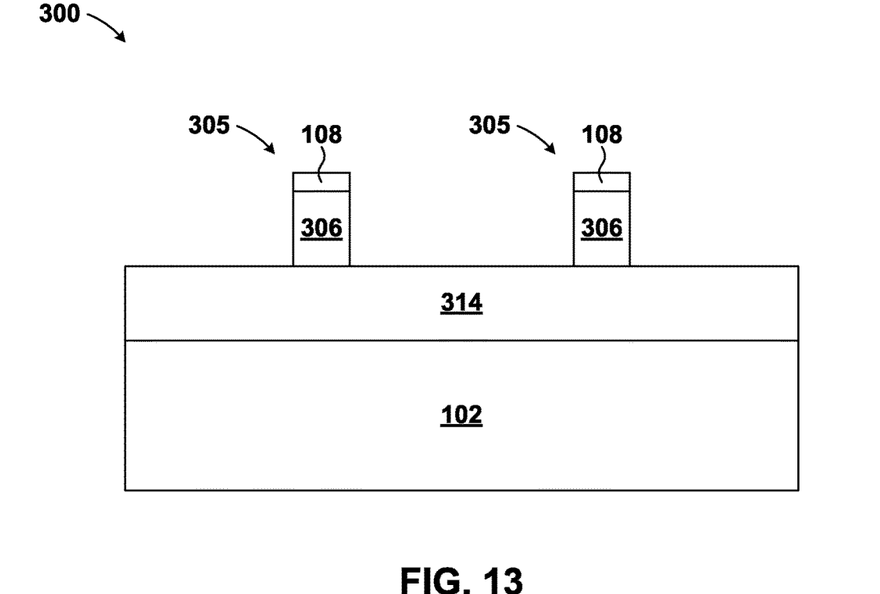
FIG. 13 is a cross section view of the alternative semiconductor structure and illustrates the conversion of a first layer into a porous layer, according to an exemplary embodiment.

With reference to FIG. 13, a demonstrative illustration of the alternative structure 300 is provided during an intermediate step of a method of fabricating an SOI fin using porous silicon, according to an embodiment. More specifically, the method can include converting the first layer 104 into a porous layer 314. It should be noted, the first layer 104 may be converted into the porous layer 314 in a similar fashion as the first layer 104 converting into the porous layer 114, described in reference to FIG. 3; however, in the illustrated alternative embodiment, the first layer 104 and the porous layer 314 may extend horizontally underneath two or more alternative fins 305, such that the substrate is not exposed between adjacent fins (e.g., the alternative fins 305).

Figure 14:
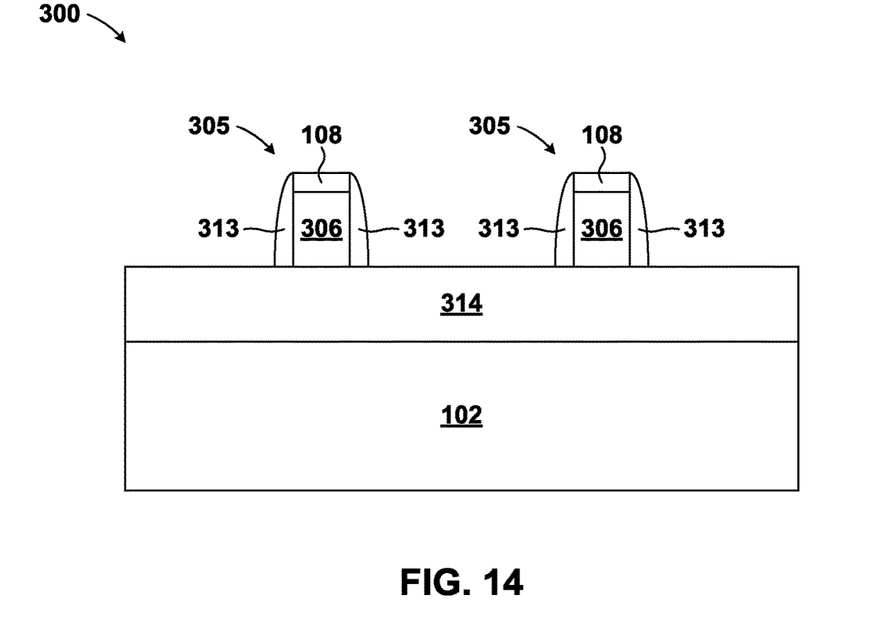
FIG. 14 is a cross section view of the alternative semiconductor structure and illustrates the formation of spacers on sidewalls of the fin, according to an exemplary embodiment.

With reference to FIG. 14, a demonstrative illustration of the alternative structure 300 is provided during an intermediate step of a method of fabricating an SOI fin using porous silicon, according to an embodiment. More specifically, the method can include forming spacers 313 on sidewalls of the alternative fin 305.

The spacers 313 may be formed on the sidewalls of the alternative fin 305 using any spacer formation technique known in the art, such as, for example, depositing a dielectric material and anisotropically etching the dielectric material. The spacers 313 may include any dielectric material known in the art, such as, for example, a silicon oxide or a silicon nitride. The spacer 313 can protect the alternative fin 305 during subsequent processing steps.

Figure 15:
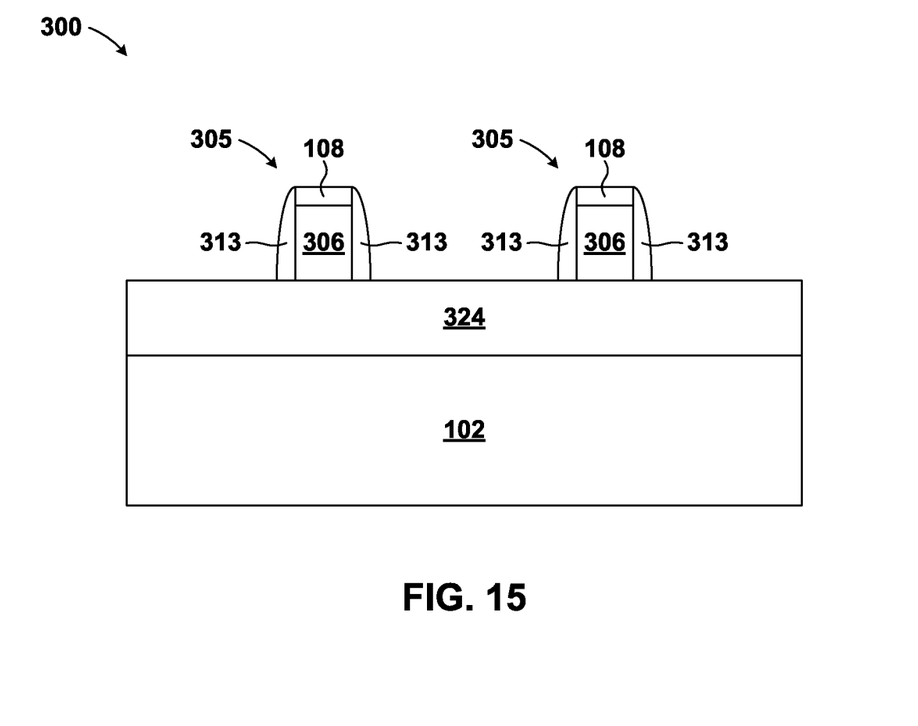
FIG. 15 is a cross section view of the alternative semiconductor structure and illustrates the conversion of the porous layer into an oxide layer, according to an exemplary embodiment.

With reference to FIG. 15, a demonstrative illustration of the alternative structure 300 is provided during an intermediate step of a method of fabricating an SOI fin using porous silicon, according to an embodiment. More specifically, the method can include converting the porous layer 314 into an oxide layer 324. The porous layer 314 may be converted into the oxide layer 324 in a similar fashion as described above in reference to the porous layer 114 converting into the oxide layer 124. In an embodiment, the alternative fin 305 is germanium; it may follow that the spacers 313 are used to prevent oxidation of the fin 305 during the oxidation of the porous layer 314.

The alternative fin 305 may have similar properties as a typical SOI fin, as is known in the art; however, the described embodiment may save processing time and cost because the alternative fin 305 was formed using a porous semiconductor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor fin on a porous semiconductor comprising:
    forming a stack of semiconductor layers on a substrate, the stack includes a second semiconductor layer on a first semiconductor layer in a layered region;
    forming fins in the second semiconductor layer by etching a trench through an exposed portion of the of the second semiconductor layer such that at least one fin of the fins includes a remaining portion of the second semiconductor layer over the first semiconductor layer;
    after the forming of the fins, converting the first semiconductor layer, without converting the remaining portion of the second semiconductor layer in the fins, into a porous semiconductor layer using a porousification process; and
    converting the porous semiconductor layer into an oxide layer.

2. The method of claim 1, wherein the trench extends through the exposed portion of the second semiconductor layer and through an underlying portion of the first semiconductor layer.

3. The method of claim 2, further comprising:
    forming a bulk region adjacent to the layered region, the bulk region includes the second semiconductor layer directly on the substrate, wherein the fins include a second fin in the bulk region, the second fin includes a portion of the second semiconductor layer.

4. The method of claim 2, further comprising:
    forming a shallow trench isolation (STI) in the trench, the STI is directly on the substrate.

5. The method of claim 1, wherein the substrate is silicon, the first semiconductor layer is p+ doped silicon, and the second semiconductor layer is n− doped silicon.

6. The method of claim 1, wherein the trench extends through the exposed portion of the second semiconductor exposing an underlying portion of the first semiconductor layer.

7. The method of claim 6, further comprising:
    forming spacers on sidewalls of the fins, wherein the spacers are above the porous semiconductor layer.

8. The method of claim 1, wherein the substrate is silicon, the first semiconductor layer is p+ doped silicon, and the second semiconductor layer includes n− doped germanium.

9. The method of claim 1, wherein the porousification process includes an electrolytic reaction.

10. A method of forming a semiconductor fin on a porous semiconductor comprising:
    forming a stack of semiconductor layers on a substrate, the stack includes a second semiconductor layer on a first semiconductor layer;
    forming fins in the stack by forming a patterned mask on the second semiconductor layer and etching a trench through exposed portions of the stack exposing a top surface of the substrate, wherein the fins include a first fin, the first fin includes a portion of the first semiconductor layer and a portion of the second semiconductor layer;
    after the forming of the fins, converting the portion of the first semiconductor layer of the first fin, without converting the portion of the second semiconductor layer of the first fin, into a porous semiconductor layer using a porousification process;
    converting the porous semiconductor layer into an oxide layer; and
    forming a shallow trench isolation (STI) in the trench, the STI is directly on the substrate, and the STI isolates adjacent fins.

11. The method of claim 10, wherein the first fin is in a layered region and a second fin is in a bulk region, the bulk region includes the second semiconductor layer directly on the substrate.

12. The method of claim 11, wherein the first fin and the second fin are each directly on the top surface of the substrate.

13. The method of claim 11, wherein the STI is in between the first fin and the second fin and isolates the first fin from the second fin.

14. The method of claim 10, wherein the substrate is silicon, the first semiconductor layer is p+ doped silicon, and the second semiconductor layer is n− doped silicon.

15. The method of claim 10, wherein the porousification process includes an electrolytic reaction.

* * * * *